United States Patent

Draper et al.

[15] 3,671,779

[45] June 20, 1972

[54] FIELD EFFECT TRANSISTOR SWITCHING ARRANGEMENT FOR AMPLIFYING ONLY LOW LEVEL SIGNALS

[72] Inventors: James Krishen Draper, Farnham; David Michael Chick, Bracknell, both of England

[73] Assignee: International Computers Limited, London, England

[22] Filed: Dec. 21, 1970

[21] Appl. No.: 100,023

[30] Foreign Application Priority Data

Jan. 28, 1970 Great Britain........................4,054/70

[52] U.S. Cl.................................307/251, 307/217, 330/35

[51] Int. Cl.....................................H03k 17/16, H03k 17/60

[58] Field of Search...............307/217, 251; 328/99; 330/35

[56] References Cited

UNITED STATES PATENTS

| | | | |
|---|---|---|---|
| 3,079,511 | 2/1963 | Averyt et al. | 307/217 |
| 3,286,189 | 11/1966 | Mitchell et al. | 307/251 X |
| 3,393,325 | 7/1968 | Borror et al | 307/217 X |
| 3,488,520 | 1/1970 | Hunter | 307/251 |
| 3,509,372 | 4/1970 | Bicking | 307/251 X |
| 3,569,737 | 3/1971 | Bauer | 307/251 X |

*Primary Examiner*—John S. Heyman
*Attorney*—Hane, Baxley & Piecens

[57] ABSTRACT

An output amplifier is fed from a load via a F.E.T. pre-amplifier included in switching means for disabling conduction of F.E.T. pre-amplifier during application of certain input signals to the load.

8 Claims, 3 Drawing Figures

INVENTORS
JAMES KRISHEN DRAPER
DAVID MICHAEL CHICK
By Hane, Baxley and Spiecens
ATTORNEYS

FIELD EFFECT TRANSISTOR SWITCHING ARRANGEMENT FOR AMPLIFYING ONLY LOW LEVEL SIGNALS

BACKGROUND OF THE INVENTION

This invention relates to electronic amplifier switching apparatus.

It has been found with various types of data processing and communication apparatus that it is necessary to drive a load with a relatively high level input signal, while, at a subsequent time, a detectable low level output signal is obtained from the load. Thus, in common write-read data recording systems using a single recording head and radio and line communications transmit-receive circuits a relatively high potential (and high energy) input signal is applied to a load, e.g. recording head, in order to allow a detectable output signal to be extracted from the load.

In systems in which a device is used as a load in one mode, e.g. a write mode, and as a source in another, e.g. a read mode, highly sensitive low-level signal amplifiers must be provided to amplify an output or read signal. One problem with such systems is that a signal amplifier will be easily damaged if a high level input signal is allowed to be applied directly to a low-level output signal amplifier. In order to protect a signal amplifier from the damaging effect of a high level input signal, it is known to provide a switch, say between the load and signal amplifier. The switch is required to be conducting during the "read" mode and must be non-conducting during the "write" mode. Semiconductor diode switches have been proposed for this function with diodes being biased to a conducting state by the application of a d.c. current and biased to a non-conducting condition by the removal of that current.

Since the signal amplifiers, which may be discrete component devices or integrated circuit devices, are highly sensitive, it is important to control the noise content of a read signal in order to produce an output signal with a satisfactory signal-to-noise ratio. A problem which arises from the use of diode switches is that thermal and shot-effect noise produced by the semiconductor diodes is added to the noise content of the read signal extracted from the load with the resulting signal-to-noise ratio of the output signal being substantially reduced.

SUMMARY OF THE INVENTION

According to the present invention, there is provided electronic amplifier switching apparatus comprising a switching arrangement having a field effect transistor connected as a preamplifier between a load and an output signal amplifier, and control means for causing or inhibiting application of input signals to the load, the control means also be operative to cause the switching arrangement to enable or disable conduction through the preamplifier so as to isolate the output signal amplifier from said input signals.

BRIEF DESCRIPTION OF THE DRAWING

Electronic amplifier switching apparatus embodying the present invention will now be described, by way of example, with reference to the accompanying drawing, in which.

DESCRIPTION OF THE PREFERRED EMBODIMENTS

Figure 1:
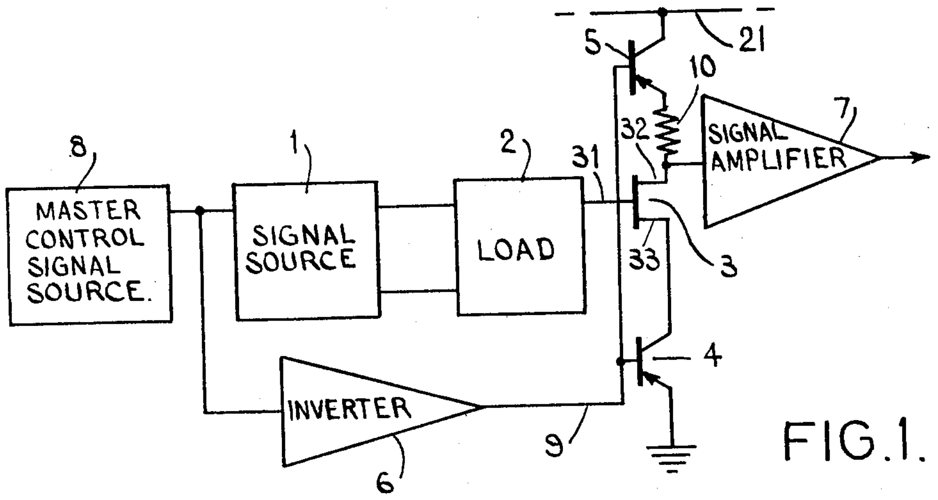
FIG. 1 shows a diagrammatic view of one embodiment.

Referring now to FIG. 1, there is shown a signal source 1 which applies relatively high level write or transmit signals to a load 2 when signal source 1 is energized upon receipt of a signal from master control signal source 8. The load 2 is connected to the gate electrode 31 of a field effect transistor (F.E.T.) 3. The source electrode 33 of F.E.T. 3 is connected through the current path of transistor 4 to ground while the drain electrode 32 is connected to one end of resistor 10. The other end of resistor 10 is connected through the current path of transistor 5 to a negative voltage supply line 21.

A signal amplifier 7 is connected to a point between register 10 and the drain electrode 32 of F.E.T. 3. The master control signal source 8 is connected to an inverter 6, the output of which is applied over line 9 to the base of transistor 4 and the base of transistor 5. The collector electrode of transistor 5 is connected to a negative voltage supply 21 and the emitter is connected to resistor 10. The emitter of transistor 4 is grounded while the collector is connected to source electrode 33.

In operation, a master control signal produced by source 8 energizes signal source 1 such that a relatively high level input signal is applied to load 2. The master control signal is also applied to inverter 6 which produces an output over line 9. If, for example, the master control signal is a binary "1," the inverter output will be a signal of the opposite state or a binary "0." The inverter output signal will render both transistors 4 and 5 non conductive, e.g. by switching the transistors from an "ON" condition to an "OFF" condition. With transistors 4 and 5 in a non-conductive state, F.E.T. 3 is also rendered non-conductive so that no signal is applied as an input to signal amplifier 7. Thus the signal amplifier 7 is isolated from input signals produced by source 1 in the "write" mode of the apparatus.

In the absence of a master control signal, signal source 1 is inhibited such that input signals cannot be applied to the load. However, inverter 6 will produce a signal over line 9 which renders transistors 4 and 5 conductive thereby activating F.E.T. 3. In this instance, load 2 will act as a low level signal source and F.E.T. 3 functions as a low noise pre-amplifier. Thus, any signals generated or received by the load 2 are applied to signal amplifier 7 after pre-amplification by F.E.T. 3. In view of the fact that the thermal and shot noise effects of diode switching arrangements are not present in the field effect transistor 3, an improved signal-to-noise ratio in the out of amplifier 7 is achieved, while, at the same time, signal amplifier 7 is protected from the damaging effect of high level input signals.

Figure 2:
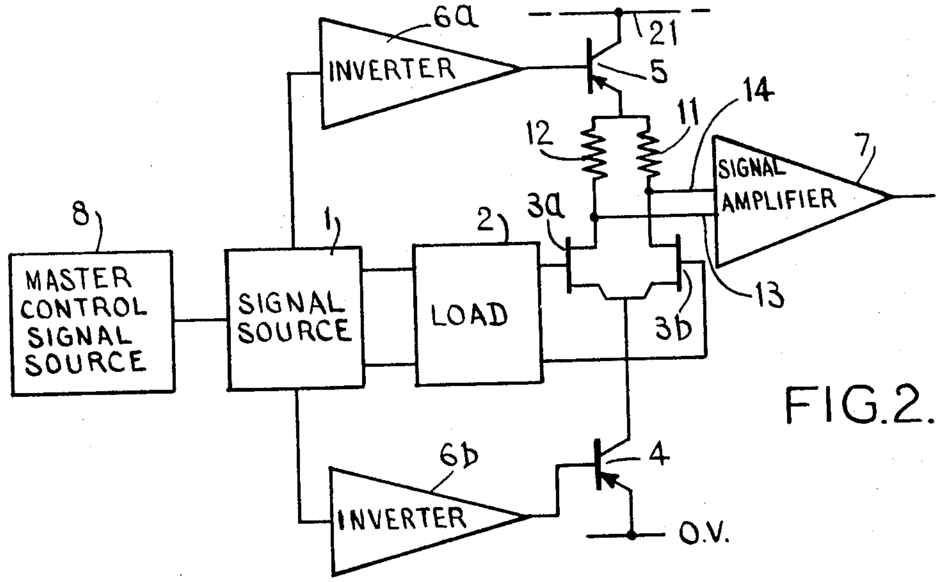
FIG. 2 shows a diagrammatic view of another embodiment.

In FIG. 2, a "push pull" arrangement is shown in which two switching field effect transistors *3a* and *3b* are shown with the gate electrode of each F.E.T. connected to load 2. Resistors 11 and 12 are connected to the drain electrodes of F.E.T.'s *3b* and *3a*, respectively and to the emitter of transistor 5. Signal source 1 is connected to the base of transistor 4 through inverter *6b* and to the base of transistor 5 via inverter *6a*. The drain electrode of F.E.T. *3a* is connected over line 13 as one input of signal amplifier 7 while the drain electrode of F.E.T. *3b* is connected over line 14 as another input. Signal amplifier 7, then, responds as a differential amplifier. The source electrodes of F.E.T.'s *3a* and *3b* are connected together in a long trailed pair configuration with transistor 4 acting as the active element of the long trailed pair as well as a control switch to activate the F.E.T.'s *3a* and *3b*.

By employing both transistors 4 and 5 as switches for controlling F.E.T.'s *3a* and *3b*, the effect of any high voltage spikes that may be produced across the load will be reduced. Such voltage spikes are possible when the load 2 is essentially inductive and the signals produced by source 1 are square waves or other signals having fast rise times. Operation of both transistors 4 and 5 will cause the electrodes of the F.E.T.'s to "float" such that the F.E.T. device will not break down when a high voltage spike appears across the load 2.

It will be appreciated that under certain operating conditions it will be possible to replace transistor 4 with a resistance and, under these circumstances, transistor 5 will operate to activate F.E.T.'s *3a* and *3b*. Also, it is possible to shunt the output appearing on the drain electrodes of F.E.T.'s *3a* and *3b* by connecting that output to the zero voltage line if only a single input is required by signal amplifier 7. This results in a balance to unbalance conversion in the F.E.T. stage when only a single input to signal amplifier is required.

Figure 3:
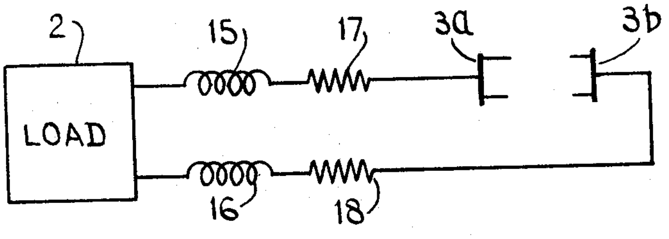
FIG. 3 shows a schematic view of a modified portion of the embodiment of FIG. 2.

In certain cases in which high voltage spikes are likely to occur across load 2 rather frequently, F.E.T.'s *3a* and *3b* may be further protected by adding a small inductance between the load 2 and the F.E.T. stage as shown in FIG. 3. Current limiting resistances 17 and 18 may be added in series with inductances 15 and 16, respectively. The value of these resistances however, must be kept low in relation to the equivalent noise resistances of the F.E.T.'s *3a* and *3b*. In this manner, the displacement current which can flow into the stray capacitance of the F.E.T.'s is limited.

It will be realized that signal source 1 may be connected so as to supply more than one load. For example, by appropriate switching circuits being inserted between signal source 1 and a load, input signals may be easily applied to many loads. Each load, however, will require a separate F.E.T. stage and signal amplifier. Switching transistors 4 and 5 may be switched between many source and drain electrodes, respectively, if it is required to activate only one F.E.T. stage 3 at a time. Also, only a single inverter 6 will be required along with transistors 4 and 5 under such conditions.

Transistors 4 and 5 may either p-n-p or n-p-n while F.E.T. 3 may be either a p-channel or n-channel device. If, however, automatic switching is not required, the transistors 4 and 5 may be replaced by mechanically operated devices or may be separate contacts on a master control switch.

Signal amplifier 7 may be discrete component amplifier or an integrated circuit amplifier. It has been found that an integrated circuit amplifier allows an improvement in the system signal-to-noise ratio when compared to the direct connection of signal amplifier 7 to load 2. This is because the noise level obtainable from the F.E.T. pre-amplifier stage is superior to that obtainable with integrated circuit devices.

We claim:

1. Electronic amplifier switching apparatus comprising a source of high level input signals; a device connected to receive said signals and adapted to produce therefrom low level output signals; an output signal amplifier; a field effect transistor connected as a preamplifier between the device and the output signal amplifier; a switching arrangement for enabling or disabling conduction through the field effect transistor; and a control means for causing or inhibiting application of high level input signals to the device, the control means also being connected to control operation of the switching means such that whilst high level signals are being applied to the device conduction through the field effect transistor is disabled and such that in the absence of high level signals, the conduction through the field effect transistor is enabled to feed the low level signals to the output signal amplifier.

2. Electronic amplifier switching apparatus as claimed in claim 1, in which the switching means includes a first transistor having its collector-emitter circuit arranged in series combination with a first controlled electrode of the field effect transistor; a second transistor having its collector-emitter circuit arranged in series combination with a second controlled electrode of the field effect transistor; and means for commonly connecting the first and second transistors to the control means for simultaneously controlling conductivity of the first and second transistors.

3. Electronic amplifier switching apparatus as claimed in claim 1, in which the switching means includes a first transistor having its collector-emitter circuit arranged in series combination with a first controlled electrode of the field effect transistor; a second transistor having its collector-emitter circuit arranged in series combination with a second controlled electrode of the field effect transistor; a resistor connected in series combination with one of the controlled electrodes and from across which resistor is taken the input for the output signal amplifier; and means for commonly connecting the first and second transistors to the control means for simultaneously controlling conductivity of the first and second transistors thereby to control actuation of the switching arrangement.

4. Electronic amplifier switching apparatus as claimed in claim 1, and further comprising a further field effect transistor connected in combination with the first mentioned field effect transistor for push pull operation on two outputs from said device to provide inputs for differential operation of the output signal amplifier.

5. Electronic amplifier switching apparatus as claimed in claim 1, and further comprising a further field effect transistor connected in combination with the first mentioned field effect transistor for push pull operation on two outputs from said device to provide inputs for differential operation on two outputs from said device to provide inputs for differential operation of the output signal amplifier; a first transistor in the switching arrangement having its collector-emitter circuit connected in series combination with first similar controlled electrodes of both field effect transistor, a second transistor in the switching arrangement having its collector-emitter circuit connected in series combination with second similar controlled electrodes of both field effect transistors; and means for commonly connecting the first and second transistors to the control means for simultaneously controlling conductivity of the first and second transistors thereby to control the operation of the switching arrangement.

6. Electronic amplifier switching apparatus as claimed in claim 5, and comprising a different resistor connected in series combination with said first mentioned similar controlled electrodes, the inputs for differential action of the output signal amplifier being taken from across the respective resistors.

7. Electronic amplifier switching apparatus as claimed in claim 4, and further comprising spike protection inductors each connected in a different output from said device.

8. Electronic amplifier switching apparatus as claimed in claim 7, and further comprising current limiting resistors each connected in series with said inductor and each having a resistance that is low compared to the equivalent noise resistance of the field effect transistors.

* * * * *